United States Patent
So

(10) Patent No.: US 7,067,394 B2
(45) Date of Patent: Jun. 27, 2006

(54) MANUFACTURING OF MONOLITHICALLY INTEGRATED PIN STRUCTURES

(75) Inventor: Daniel So, Palo Alto, CA (US)

(73) Assignee: Intel Corporation, Santa Clara, CA (US)

( * ) Notice: Subject to any disclaimer, the term of this patent is extended or adjusted under 35 U.S.C. 154(b) by 166 days.

(21) Appl. No.: 10/787,876

(22) Filed: Feb. 25, 2004

(65) Prior Publication Data

US 2005/0186759 A1    Aug. 25, 2005

(51) Int. Cl.
*H01L 21/46* (2006.01)
(52) U.S. Cl. ............................ 438/455; 438/459
(58) Field of Classification Search ............... 438/455, 438/459
See application file for complete search history.

(56) References Cited

U.S. PATENT DOCUMENTS

| | | | | |
|---|---|---|---|---|
| 4,897,362 A | * | 1/1990 | Delgado et al. | 438/406 |
| 5,488,012 A | * | 1/1996 | McCarthy | 438/479 |
| 5,760,443 A | * | 6/1998 | McCarthy | 257/347 |
| 6,191,007 B1 | * | 2/2001 | Matsui et al. | 438/459 |
| 2005/0280103 A1 | * | 12/2005 | Langdo et al. | 257/401 |

OTHER PUBLICATIONS

Soref: Silicon-Based Optoelectronics; Dec. 1993; Proceedings of the IEEE, vol. 81, No. 12; pp. 1687-1706.
Gösele, et al.; Semiconductor Wafer Bonding; 1997; IEEE; pps. 23-32.
Tang, et al.; Highly Efficient Ge Detector Integrated with Waveguide Based on SOI Technology; Jan. 2001; Proceedings 2001; Proceedings of SPIE, vol. 4293; pps. 114-117.
Chui, et al.; A Sub-400°C Germanium MOSFET Technology with High-K Dielectric and Metal Gate; 2002; IEEE; pps. 437-440.

* cited by examiner

*Primary Examiner*—David S. Blum
(74) *Attorney, Agent, or Firm*—Fish & Richardson P.C.

(57) ABSTRACT

Fabrication techniques for fabricating p-i-n structures that achieve a thin intrinsic layer and a small resistance across the p-i-n structure and thus a high response speed in a monolithically integrated circuit package. Germanium p-i-n structures may be fabricated over silicon or silicon-on-insulator substrates using silicon processing technologies.

31 Claims, 7 Drawing Sheets

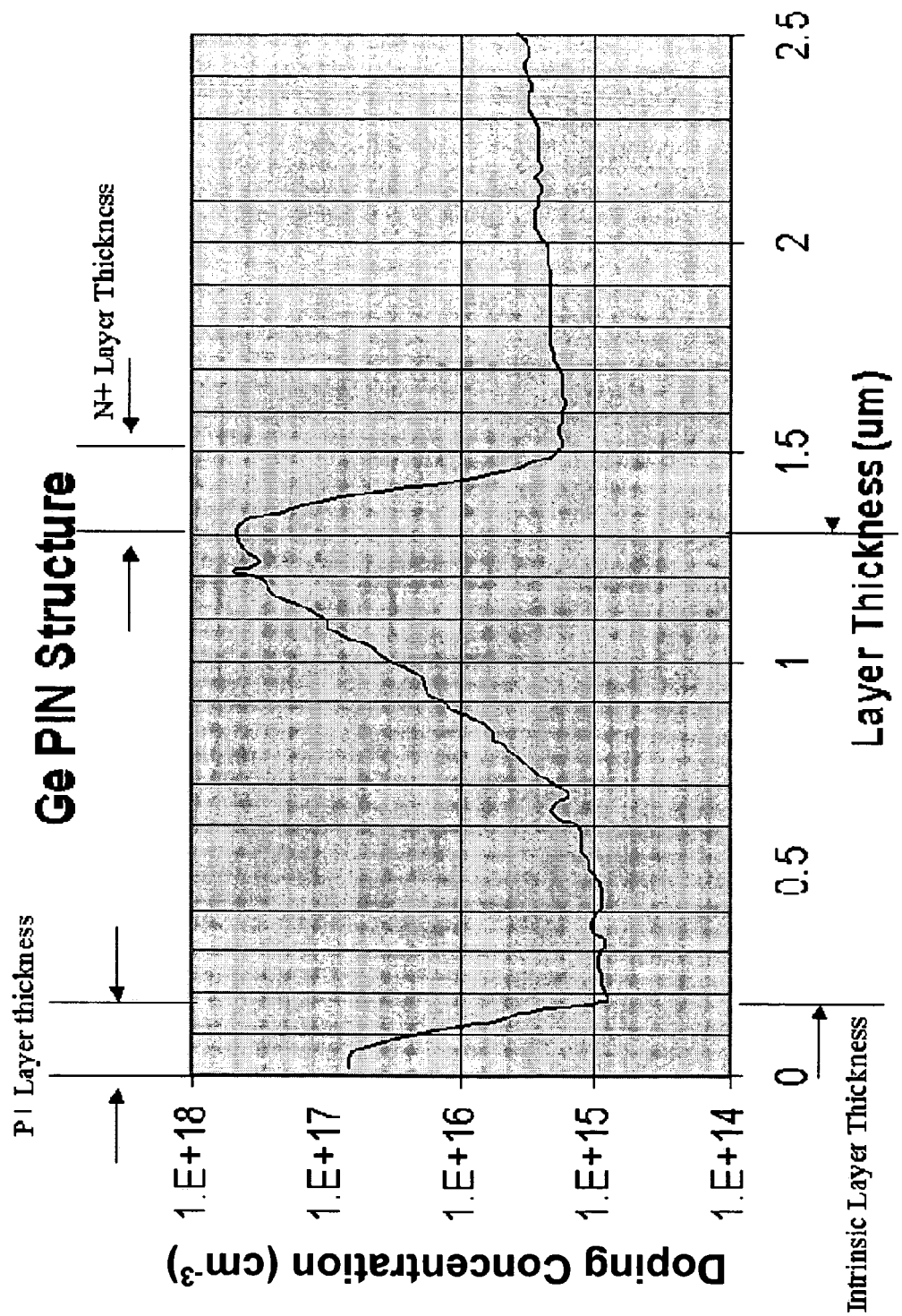

MANUFACTURING OF MONOLITHICALLY INTEGRATED PIN STRUCTURES

All rights in connection with this application are assigned to Intel Corporation.

BACKGROUND

This application relates to integrated semiconductor circuits and devices, and more specifically, to fabrication of integrated semiconductor circuits and devices having integrated photonic components, devices, and systems.

Integration of integrated circuits and optoelectronic circuits is desirable in many applications, including various optical sensing devices, imaging devices, and optical fiber communication devices and systems near 1.31 and 1.55 microns. One of widely-used components in optoelectronic circuits is optical detectors for converting optical signals into electronic signals. A photodiode may be used as an optical detector in optoelectronic circuits. Typically, such a photodiode includes a three-layer p-i-n (PiN) structure that is electrically biased to be sensitive to received light. The "p" layer in the PIN structure is a p-doped layer; the "i" layer is an undoped intrinsic layer or a lightly-doped layer; and the "n" layer is a n-doped layer. For sensing light near 1.31 and 1.55 microns, indium phosphide (InP) and germanium (Ge) may be used as the light sensing materials to form p-i-n structures in photodiode detectors.

BRIEF DESCRIPTION OF THE DRAWINGS

FIG. 1 shows a measured spreading resistance profile (SRP) for a Ge PiN structure prepared by a molecular beam epitaxy (MBE) process.

DETAILED DESCRIPTION

Figure 2A:
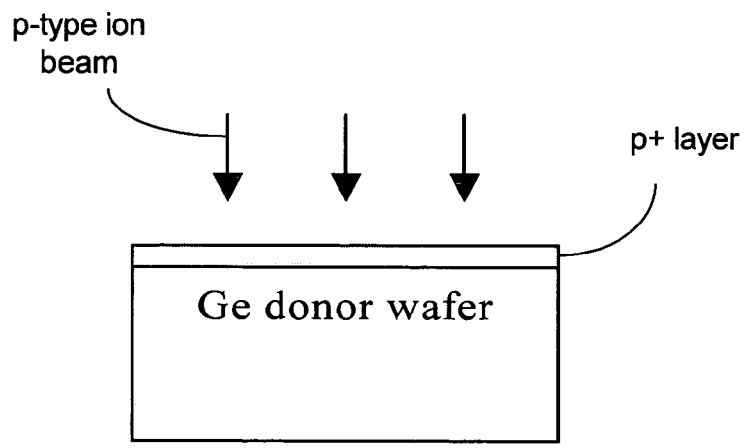
FIGS. 2A through 2E show an exemplary workflow in fabricating a Ge PiN structure and corresponding structures for each of the processing steps.

Implementations of fabrication techniques described in this application are designed in part to produce a high doping concentration in each of the doped p-type and n-type conductive layers and a spatially abrupt transition in the doping concentration within the intrinsic layer beyond the interface with the doped p-type or n-type conductive layer in a p-i-n (PiN) structure. This abrupt transition in the doping level in the intrinsic layer may be achieved by reducing the diffusion of dopants from the doped p-type or n-type conductive layers into the intrinsic layer. Hence, implementations of fabrication techniques described in this application may be used to achieve a thin intrinsic layer with a thickness of about a fraction of one micron to yield a small resistance across the p-i-n structure and thus a high response speed for applications such as detection of optical signals with high data rates.

In one implementation, the fabrication of a p-i-n structure may include the following processing steps. Dopant ions of a first conductivity type (e.g., the p-type conductivity) are implanted in an ion implantation process to one side of a donor wafer to form a p-type implanted layer in the donor wafer. A rapid thermal annealing process is subsequently performed to anneal the p-type conductive layer. This process is in part to activate the implanted dopant ions. A handle wafer, e.g., a silicon wafer, is then bonded to the p-type conductive layer. The donor wafer is thinned to leave one layer of the donor wafer above the p-type conductive layer. Next, dopant ions of a second conductivity type (e.g., the n-type) are implanted to an exposed surface of the thinned layer of the donor wafer to form a n-type conductive layer and to maintain a layer of the donor wafer as an intrinsic layer between the p-type conductive layer and the n-type conductive layer. A second rapid thermal annealing process is performed to anneal the n-type conductive layer. This completes the p-i-n structure.

The above fabrication method uses the ion implantation to form both p-type and n-type conductive layers in the donor wafer and rapid thermal annealing processes at relatively low temperatures in short durations to reduce the thermal budget when annealing the conductive layers. The low thermal budget can reduce the associated thermal diffusion of the implanted dopant ions into the remaining layer of the donor wafer and thus can produce a desired abrupt spatial transition in the doping concentration within the intrinsic layer beyond the interface with the doped p-type or n-type layer. In addition, the annealing processes with low thermal budgets can prevent delamination of the transferred thin donor wafer layer from the handle wafer due to the thermal stress induced by the difference in the coefficients of thermal expansion of the donor wafer and handle wafer materials. For example, if the donor wafer is made of Ge with a coefficient of thermal expansion of about $5.9 \times 10^{-6}/°$ C. at a room temperature of about 27° C. and the handle wafer is made of Si with a coefficient of thermal expansion of about $2.6 \times 10^{-6}/°$ C. at the room temperature, the coefficient of thermal expansion of silicon is less than one half of the coefficient of germanium. This large difference may cause sever thermal stress at the interface between the donor wafer and the handle wafer when the thermal budget is relative high such as in the molecular beam epitaxy (MBE) process. This thermal stress at the interface may cause the donor and handle wafers to separate or delaminate.

One of the applications for the fabrication techniques described in this application is to fabricate integrated Germanium photodiodes and other Germanium based devices. Germanium based devices may be used as a low cost alternative to the InP based devices. Germanium is a small bandgap semiconductor material to produce a broad absorption spectral range in the infrared region and has a relatively large absorption coefficient in the infrared region including the wavelengths of around 1.31 micron and 1.55 micron for fiber communications. The fabrication process for germanium devices may use a wafer transfer process to fabricate a Germanium layer to a handle wafer so that subsequent fabrication steps after the transfer are compatible to standard silicon IC processes such as CMOS or MOS processes. This compatibility with silicon IC processes allows for use of silicon processing technologies in fabricating Ge devices without separate special processing technologies. Hence, a silicon fabrication system or facility may be used to process germanium materials with minimum modifications. Moreover, various commercially available InP wafers are generally limited to about four inches in diameter. Silicon IC fabrication tools may not be able to handle these small wafers. Large Ge wafers, e.g., with diameters of 8" or 12"

are readily available for processing with Si fabrication tools. Hence, Ge based devices have these and other advantageous over InP based devices. Fabrication techniques described here allow for fabrication of Ge PiN structures on Si and other handle wafers with desired structural configurations and properties, such as thin intrinsic layers with abrupt spatial transition in the doping concentration, and high doping concentrations in the doped conductive layers, for improved device performance.

The fabrication techniques described this application may be used to mitigate technical limitations associated with the use of the molecular beam epitaxy (MBE) process and other processes with high thermal budgets to fabricate p-i-n structures. For example, Ge photodiodes were reported to be fabricated on a graded SiGe intermediate layer on the silicon-on-insulator (SOI) using the MBE process. Ge PiN detectors fabricated by the MBE process, however, were measured to exhibit an undesired long diffusion tail into the intrinsic layer of the p-i-n structure.

FIG. 1 illustrates a measured spreading resistance profile (SRP) for a Ge PiN structure prepared by the MBE process at a typical operating temperature of about 700° C. for about several hours (e.g., 4 hours). One of the difficulties in making these Ge PiN detectors is in controlling the doping profile during the epitaxial growth in the MBE process. The PiN stack is grown typically around 700° C. to 750° C. during the MBE process. The processing duration for several hours and the processing at around 700° C. effectuate a thermal budget that is sufficient to cause the dopant to diffuse out of the doped layer into the intrinsic layer. This diffusion creates a long diffusion tail in the doping profile from the n+ layer into the intrinsic layer. In the example shown in FIG. 1, the spatial extent of the doping profile at the half maximum is about 0.4 micron from the boundary of the n+ layer into the intrinsic Ge layer. This presence of n-type dopants (e.g., phosphorus ions) in the intrinsic layer is not desirable because a relatively intrinsic layer, e.g., about one micron or more, may be needed to sufficiently separate the p+ and n+ regions. In addition, the doping concentration in the MBE process is capped by an upper limit (e.g., around $10^{17}$ cm$^{-3}$). Hence, the combination of the increased thickness in the intrinsic layer due to the significant thermal diffusion caused by the high thermal budget and the limited doping concentration in the MBE process increases the sheet resistivity of the resulting PiN structure. Accordingly, the response speed of the PiN structure fabrication by the MBE process is adversely reduced.

FIGS. 2A, 2B, 2C, 2D, and 2E illustrate exemplary processing steps and corresponding device structures for fabrication of a Ge PiN structure where a wafer transfer and rapid thermal processes are used to avoid the use of the MBE process. The illustrated fabrication workflow combines wafer bonding, ion implantation and rapid thermal annealing at relatively low operating temperatures in short thermal cycle durations. Notably, the MBE process is not used here to mitigate the long diffusion tail caused by the MBE processing and to achieve a higher doping concentration. The wafer bonding allows for heterogeneous integration of Ge onto Si or SOI wafer. While the combination of ion implantation and rapid thermal annealing provides a doping profile and doping concentration that are generally difficult to achieve by other means such as the MBE process. More specifically, the ion implantation allows for a doping concentration at or higher than $10^{19}$ cm$^{-3}$ to be achieved in the doped conductive p-type and n-type layers; the rapid thermal annealing allows for performing the annealing of the implanted p-type and n-type regions at a relative low temperature below 700° C. (e.g., 400° C. or 600° C.) and in a short annealing period (e.g., about tens of seconds or less) to significantly reduce the thermal-induced diffusion of the dopant ions and thermal stresses at the interface of the bonded layers. As a result, the intrinsic layer between the n-type and p-type conductive layers may be less than about 1 micron such as about 0.5 micron or less while still providing sufficient separation between the p-doped and n-doped conductive layers.

In FIG. 2A, a lightly-doped or undoped germanium substrate is prepared and cleaned as the Ge donor wafer. The material of this Ge donor wafer will be used to form the intrinsic layer in the PiN structure. First, one side of the Ge donor wafer is implanted with dopant ions in the conductivity of the first type (n-type or p-type) by applying an ion implantation process. Ion implantation processes are well known in semiconductor fabrication. For example, p-type dopant ions $BF_2^+$ in an ion beam at an energy of about 35 keV with a density of about $4\times10^{15}$ cm$^{-2}$ may be used to implant the $BF_2^+$. This process produces a p-type conductive layer over the Ge donor wafer. Second, a rapid thermal annealing process is performed at an operating temperature of about 400° C. in $N_2$ gas for about 30 seconds to anneal the p+ layer on the lightly doped or intrinsic germanium donor wafer. This process is designed to operate under a low thermal budget to reduce the thermal-induced diffusion from the doped layer to the intrinsic layer. Various rapid thermal annealing treatments may be applied.

Figure 2B:
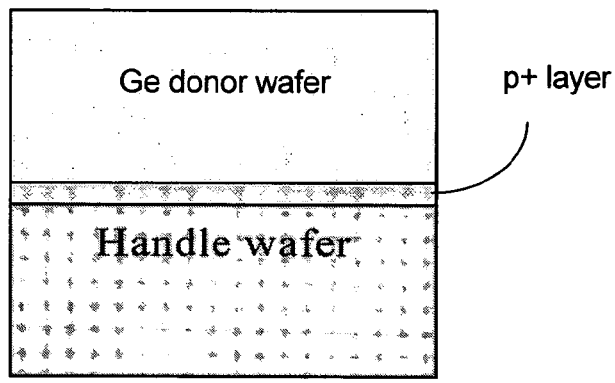

FIG. 2B shows bonding of a separate handle wafer to the above processed Ge donor wafer by bonding one side of the handle wafer to the first conductive layer on the Ge donor wafer. The handle wafer may be, for example, a silicon wafer, a silicon-on-insulator (SOI) wafer, a silica-on-silicon wafer, Ge-doped silicon, silicon oxynitride, a glass wafer, or sapphire wafer. As described, the thinned donor wafer is transferred to the handle wafer and processing subsequent to the transfer is performed on the handle wafer. Hence, the handle wafer may be selected to be processed using silicon processing technologies. Wafer bonding of two different wafers is known in the art. Any suitable wafer bonding technique may be used to perform this bonding process. The plasma activation method may be used in the wafer bonding process to activate a wafer surface to be bonded. This plasma activation uses a plasma to treat the wafer surface to increase the surface energy of the treated surface for enhanced adhesion for bonding. This method does not involve the use of an oxide layer and hence may be preferred in some circumstances.

Figure 2C:
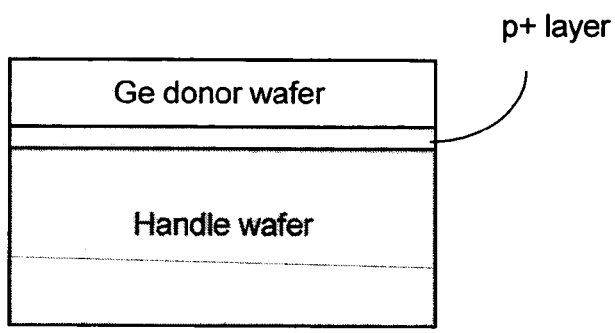
Figure 2D:
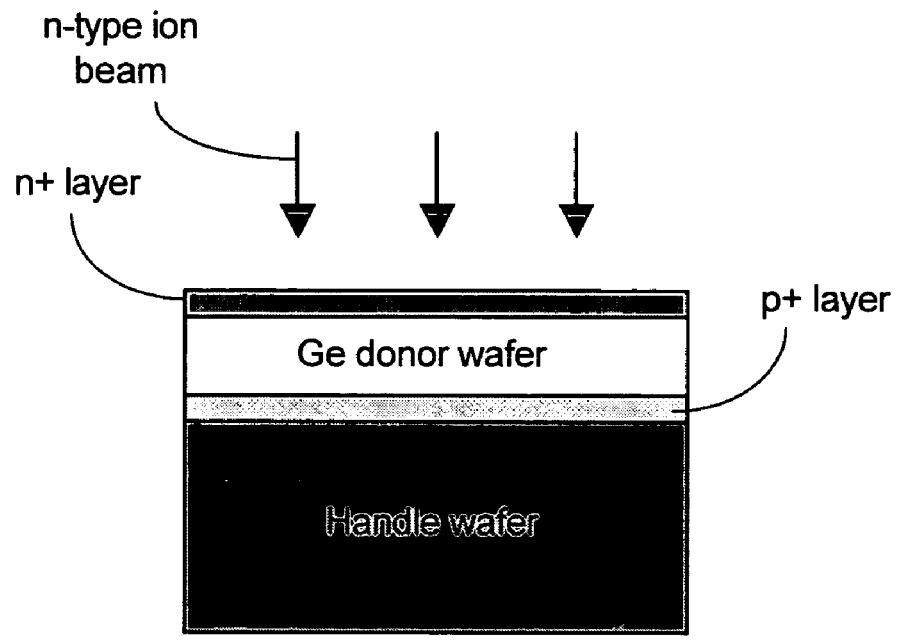

At the step shown in FIG. 2C, the exposed side of the Ge donor wafer is thinned by cutting or lapping with a predetermined total thickness for the intrinsic layer and the second conductive layer with a second type conductivity (e.g., n-type). For example, wafer thinning procedures described in the above cited Gosele may be used. Upon completing this process, the intrinsic and p+ Ge-layers are transferred onto the handle wafer. Subsequent processing steps are then performed over the handle wafer. If the handle wafer is a silicon or SOI wafer, then suitable silicon processing techniques may be used in the subsequent processing steps, including the CMOS and MOS techniques.

The above thinning process in FIG. 2C exposes one side of the Ge donor wafer. Next, a second ion implantation process is applied to implant dopant ions of a second type conductivity (e.g., the n-type) into the exposed side of the Ge donor wafer. This process produces a second conductive layer with the second type conductivity (e.g., n-type). Another rapid thermal annealing is performed to anneal the second conductive layer. For example, this annealing may be performed in $N_2$ gas at an operation temperature of about 600° C. for about 10 seconds to maintain a low thermal budget. This low thermal budget is used to reduce the thermal diffusion of the dopants into the intrinsic layer and the thermal stress at the bonding interface between the donor wafer and the handle wafer. At the end of this annealing process, the basic Ge PiN structure is monolithically formed on the handle wafer.

Figure 2E:
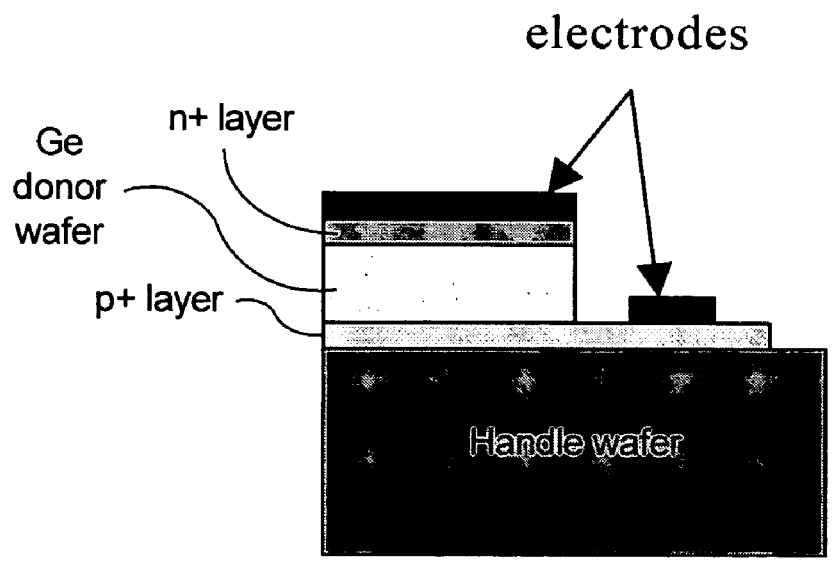

Next, the Ge PiN structure may be patterned to form electrodes on the p-type and n-type conductive layers for applying an electrical bias on the PiN structure. For example, FIG. 2E shows that a portion of the n-type conductive layer and the intrinsic layer may be removed to expose a part of the underlying p-type conductive layer for forming its electrode. Certainly additional fabrication steps may be performed on the handle wafer to manufacture other structures and circuits which may control the operation of the PiN structure and add other functionalities to the chip.

Figure 3:
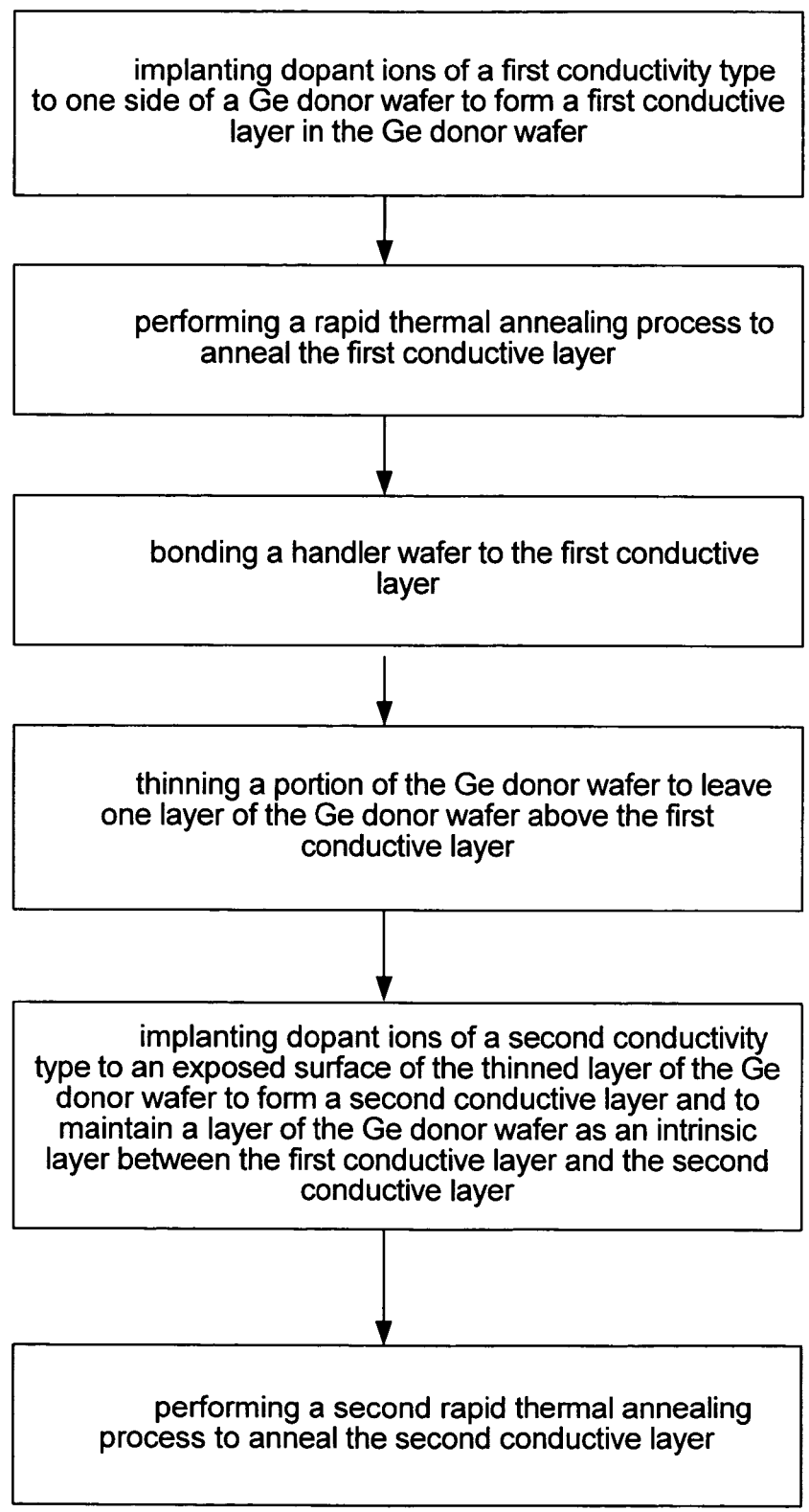
FIG. 3 shows one implementation of the workflow of this application.

FIG. 3 is a flowchart to illustrate the above fabrication process. The thermal budget is proportional to the product of the temperature and the duration of the process. Notably, the rapid thermal annealing processes for treating both p and n layers have thermal budgets much lower than that of the MBE process.

Figure 4A:
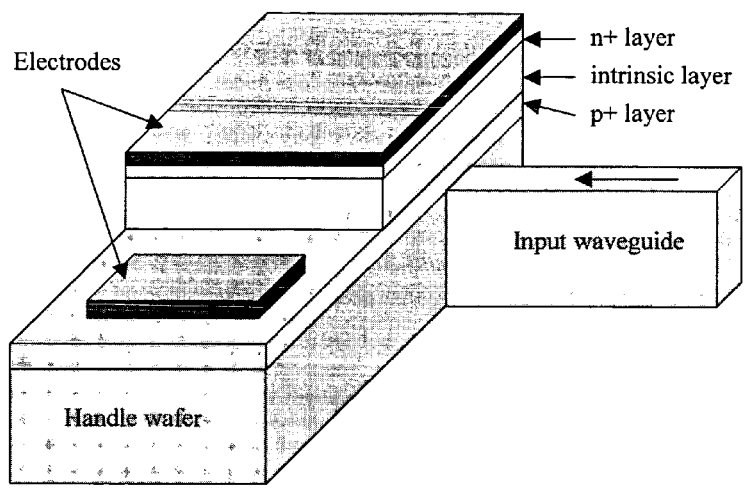
FIGS. 4A and 4B show exemplary devices based on the Ge PiN structure fabricated from the workflow in FIGS. 2A through 2E.

FIG. 4A shows a waveguide-coupled Ge photodiode based on the above-fabricated Ge PiN structure as an example. An input waveguide is formed in the handle wafer to guide light into the detector area. Since Ge has a higher index of refraction than the underneath waveguide layer, the guided wave will bend upward and incident onto the detector upon entering the detector area. The locations of the n+ and p+ conductive layers in the PiN structure for the photodiode may be interchanged.

Figure 4B:
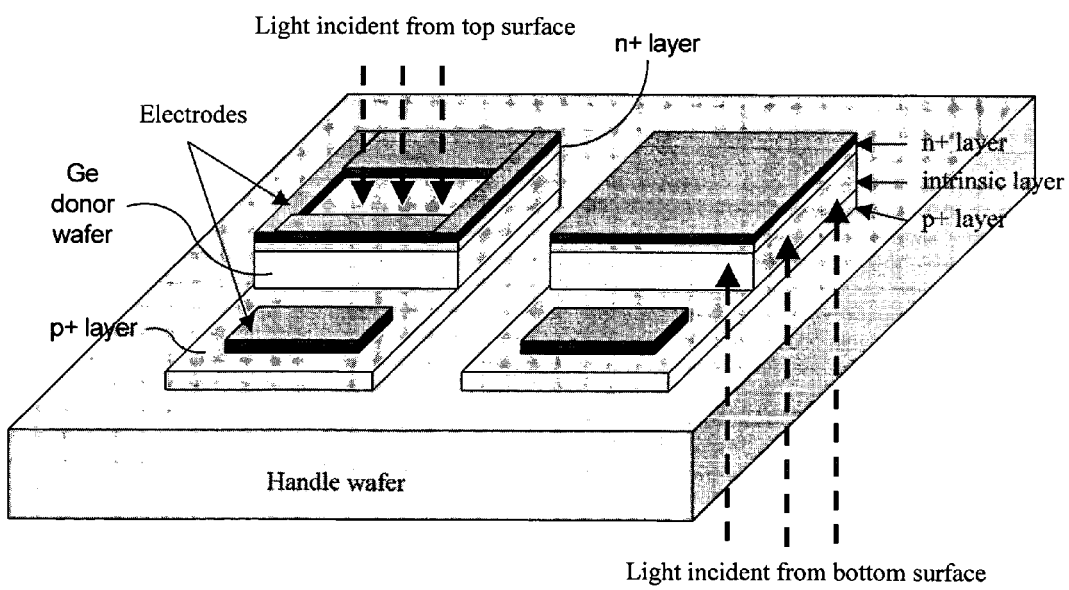

FIG. 4B shows another exemplary Ge photodiode device based on the above fabricated Ge PiN structure. Light may be coupled into the Ge PiN structure through the top conductive layer where the corresponding electrode may be made of a transparent material or is patterned to have an open aperture for receiving input light. The light may also be coupled into the Ge PiN structure via the handle wafer as illustrated if the handle wafer is transparent to the input light or is pattered to have an open aperture.

Figure 5:
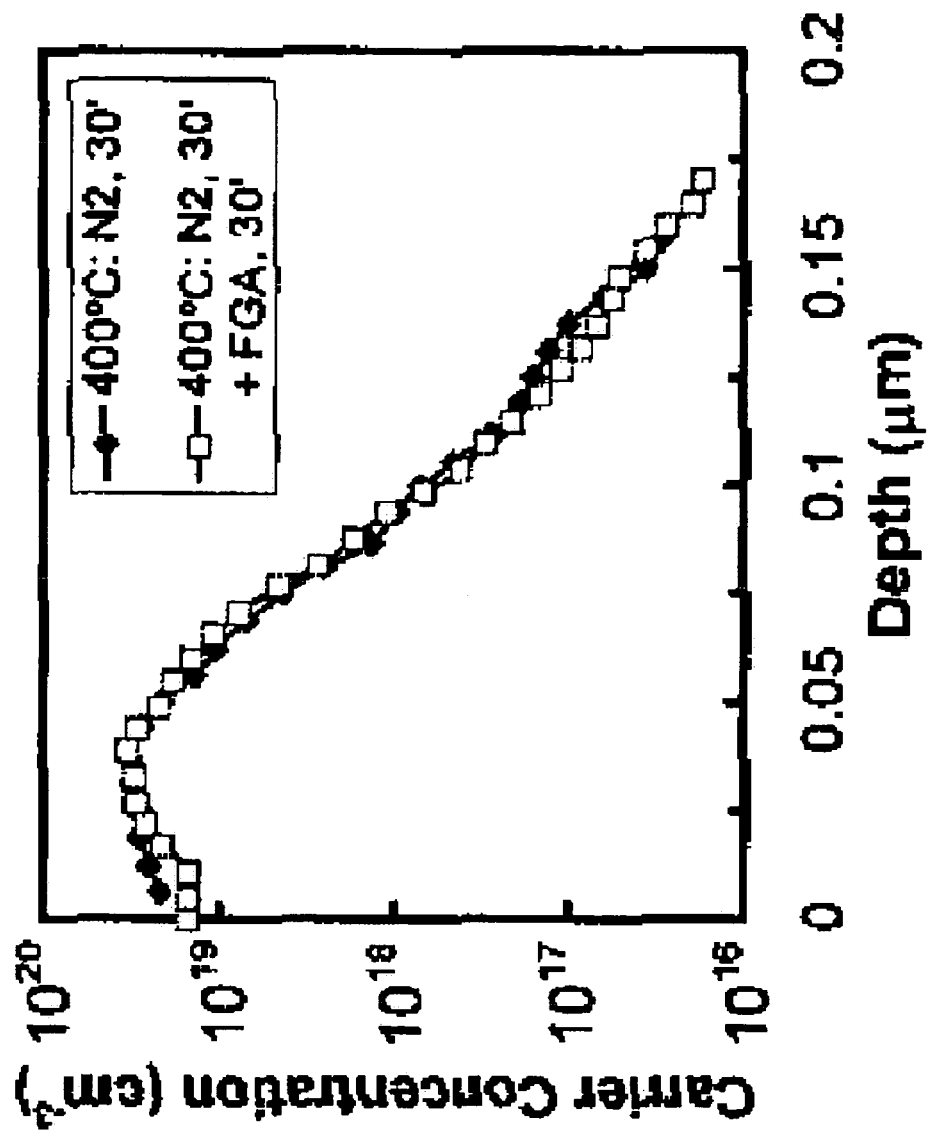
FIGS. 5 and 6 show measured spreading resistance profiles (SRPs) for Ge PiN structures prepared by combining an ion implantation process and a rapid thermal process (RTP) for annealing.
Figure 6:
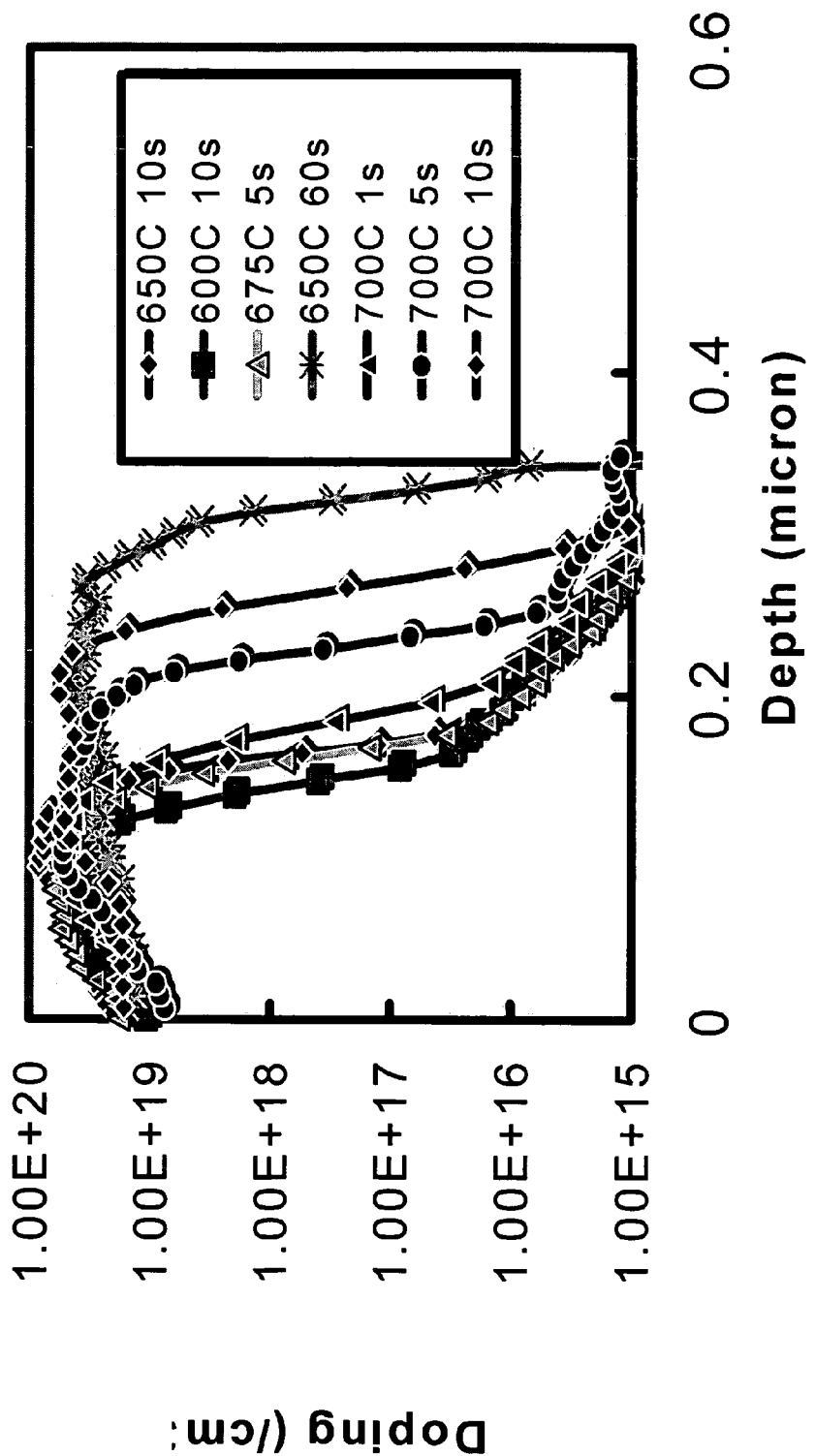

FIG. 5 shows a SRP result for a Boron doping profile achieved via ion implantation and RTP where a high doping concentration above $10^{19}$ cm$^{-3}$ and an abrupt and precise spatial doping profile are achieved based on the technique disclosed in the cited Chui. FIG. 6 shows various SRP profiles measured at different annealing temperatures and annealing durations for dopant phosphorous ions at doping concentrations from $10^{19}$ cm$^{-3}$ to $10^{20}$ cm$^{-3}$. An abrupt transition in the doping level from a doped layer to the intrinsic layer may be achieved when the doping concentration drops by three orders of magnitude within 0.1 micron, e.g., from $10^{19}$ to $10^{16}$ within 0.1 micron. In comparison with the SRP profile produced by a MBE process shown in FIG. 1, the combination of ion implantation and RTP provides significant advantage in reducing the spatial spread of the diffusion and the overall resistivity of the PiN structure.

Only a few implementations are described. However, it is understood that variations and enhancements may be made.

What is claimed is:

1. A method, comprising:
    applying an ion implantation process to implant dopant ions of a first conductivity type to one side of a donor wafer;
    performing a rapid thermal annealing process to anneal the doped one side to form a first conductive layer;
    bonding a handle wafer to the first conductive layer;
    thinning at least a portion of the donor wafer to leave one layer of the donor wafer above the first conductive layer;
    applying another ion implantation process to implant dopant ions of a second conductivity type to the one layer to form a second conductive layer while maintaining an intrinsic layer between the first and the second conductive layers; and
    performing another rapid thermal annealing process to anneal the second conductive layer.

2. The method as in claim 1, wherein the first conductivity type is the p-type and the second conductivity type is the n-type.

3. The method as in claim 1, wherein the first conductivity type is the n-type and the second conductivity type is the p-type.

4. The method as in claim 1, further comprising:
    patterning the second conductive layer and the intrinsic layer to expose a portion of the first conductive layer; and
    forming a first electrode in contact with the first conductive layer and a second electrode in contact with the second conductive layer.

5. The method as in claim 4, further comprising forming a circuit on the handle wafer to apply an electrical bias to the first and second electrodes.

6. The method as in claim 5, wherein the handle wafer is a silicon wafer or a silicon-on-insulator wafer, and the circuit is a CMOS circuit on the handle wafer.

7. The method as in claim 5, wherein the handle wafer is a silicon wafer a or silicon-on-insulator wafer, wherein the patterning and formation of the circuit are performed by silicon processing technologies.

8. The method as in claim 7, wherein the donor wafer is a germanium wafer.

9. The method as in claim 1, wherein the donor wafer is a germanium wafer.

10. The method as in claim 1, wherein the bonding of the handle wafer to the first conductive layer comprises activating the handle wafer surface by a plasma activation method.

11. The method as in claim 1, wherein each rapid thermal annealing process is performed in duration in tens of seconds or less.

12. The method as in claim 11, wherein each rapid thermal annealing process is performed at a temperature less than 700° C.

13. The method as in claim 1, wherein each rapid thermal annealing process is performed at a temperature less than 700° C.

14. The method as in claim 11, wherein the intrinsic layer is less than about 0.5 micron.

15. A method, comprising:
    applying an ion implantation process to implant dopant ions of a first conductivity type to one side of a donor wafer at a concentration of about $10^{19}$ cm$^{-3}$ or higher;
    performing a rapid thermal annealing process for a duration of tens of seconds or less to anneal the doped one side to form a first conductive layer;
    bonding a handle wafer to the first conductive layer;
    thinning at least a portion of the donor wafer to leave one layer of the donor wafer above the first conductive layer;
    applying another ion implantation process to implant dopant ions of a second conductivity type to the one layer at a concentration of about $10^{19}$ cm$^{-3}$ or higher to form a second conductive layer while maintaining an intrinsic layer between the first and the second conductive layers; and performing another rapid thermal annealing process for a duration of tens of seconds or less to anneal the second conductive layer.

16. The method as in claim 15, wherein each rapid thermal annealing process is performed at a temperature less than 700° C.

17. The method as in claim 15, wherein the intrinsic layer is less than about 0.5 micron.

18. The method as in claim 15, wherein the donor wafer comprises germanium.

19. The method as in claim 18, wherein the dopant ions of the first conductivity type comprise boron ions.

20. The method as in claim 18, wherein the dopant ions of the second conductivity type comprise phosphorus ions.

21. The method as in claim 15, wherein the handle wafer comprises silicon.

22. The method as in claim 15, wherein the handle wafer comprises a silicon on insulator.

23. The method as in claim 15, wherein the handle wafer comprises a silica on silicon.

24. The method as in claim 15, wherein the handle wafer comprises a Ge-doped silicon.

25. The method as in claim 15, wherein the handle wafer comprises a silicon oxynitride.

26. The method as in claim 15, wherein the handle wafer comprises a glass material.

27. The method as in claim 15, wherein the handle wafer comprises a sapphire material.

28. A method, comprising:

applying an ion implantation process to implant dopant ions of a first conductivity type to one side of a donor wafer comprising germanium at a concentration of about $10^{19}$ cm$^{-3}$ or higher;

performing a rapid thermal annealing process for a duration of tens of seconds or less to anneal the doped one side to form a first conductive layer;

bonding a handle wafer suitable for silicon processing to the first conductive layer;

thinning at least a portion of the donor wafer to leave one layer of the donor wafer above the first conductive layer;

applying another ion implantation process to implant dopant ions of a second conductivity type to the one layer at a concentration of about $10^{19}$ cm$^{-3}$ or higher to form a second conductive layer while maintaining an intrinsic layer between the first and the second conductive layers; and performing another rapid thermal annealing process for a duration of tens of seconds or less to anneal the second conductive layer.

29. The method as in claim 28, wherein the dopant ions of the first conductivity type comprise either boron ions or phosphorus ions.

30. The method as in claim 28, further comprising:

patterning the second conductive layer and the intrinsic layer to expose a portion of the first conductive layer; and forming a first electrode in contact with the first conductive layer and a second electrode in contact with the second conductive layer.

31. The method as in claim 28, further comprising performing a CMOS processing process to form a CMOS circuit integrated on the handle wafer.

* * * * *